(12) United States Patent
Lee et al.

(10) Patent No.: US 6,388,313 B1
(45) Date of Patent: May 14, 2002

(54) MULTI-CHIP MODULE

(75) Inventors: Ming-Hsun Lee, Taichung; Chin-Te Chen, Miaoli Hsien, both of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/774,227

(22) Filed: Jan. 30, 2001

(51) Int. Cl.$^7$ ................................................ H01L 23/02
(52) U.S. Cl. .................... 257/686; 257/723; 257/777
(58) Field of Search ................................. 257/678, 723, 257/686, 685, 692, 777

(56) References Cited

U.S. PATENT DOCUMENTS

| | | |
|---|---|---|
| 5,323,060 A | 6/1994 | Fogal et al. |
| 5,721,452 A | 2/1998 | Fogal et al. |
| 5,793,108 A | 8/1998 | Nakanishi et al. |
| 6,100,594 A * | 8/2000 | Fukui et al. ................ 257/777 |
| 6,133,637 A * | 10/2000 | Hikita et al. ................ 257/777 |

* cited by examiner

Primary Examiner—Roy Potter
(74) Attorney, Agent, or Firm—Peter F. Corless; Steven M. Jensen; Edwards & Angell, LLP.

(57) ABSTRACT

A multi-chip module is proposed, which is designed to pack two or more semiconductor chips in a stacked manner over a chip carrier in a single package. The proposed multi-chip module is characterized by the use of a reverse wire-bonding technique to allow the topmost bent portions of a first set of bonding wires connected to the bottommost chip to be positioned above the substrate rather than above the bottommost chip. Then, an adhesive layer is formed to a thickness that allows it to entirely wrap the part of the bonding wires that is positioned above the active surface of the bottommost chip to prevent the bonding wires connected to the bottommost chip to come in contact with at least one overlaid chip. This allows the prevention of voids between the two stacked chips in the encapsulation body. Moreover, the proposed multi-chip module allows the stacked chips to be variably-sized according actual needs without the problem of the bonding wires being damaged during the mounting of the overlaid chip. The overlaid chip is electrically connected to the substrate by a second set of bonding wires, and an encapsulation body is provided to encapsulate the first semiconductor chip, the first set of bonding wires, the second semiconductor chip, and the second set of bonding wires.

10 Claims, 4 Drawing Sheets

MULTI-CHIP MODULE

BACKGROUND OF THE INVENTION

1. Field of the Invention:

This invention relates to integrated circuit packaging technology, and more particularly, to a multi-chip module used to pack two or more semiconductor chips in a stacked manner and method of fabricating the same.

2. Description of Related Art:

Multi-chip packaging technology is used to pack two or more semiconductor chips over substrate or leadframe in one single package module, so that one single package module is capable of offering a manifold level of functionality or data storage capacity. Conventionally, there are two schemes to mount two or more chips on a single substrate. One scheme is to mount these chips in a side-by-side manner over the substrate. This scheme allows the resulted multi-chip module to be low in height, but one drawback is that it would require a substrate of a large surface area to implement. During SMT (Surface Mount Technology) process, a larger substrate would be more easily subjected to warpage, resulting in undesired delamination or peeling of the chips from the substrate. The finished product of the multi-chip module would therefore have reliability concern. Another scheme is to mount the chips in a stacked manner. Although this scheme would make the resulted multi-chip module greater in height, it can help to prevent the above-mentioned problem of delamination or peeling due to the use of a large substrate.

FIG. 6 is a schematic diagram showing a conventional stacked type of multi-chip module. As shown, this multi-chip module 1a includes a first chip 10a and a second chip 12a, wherein the first chip 10a is adhered to a substrate 11a and the second chip 12a is mounted over the first chip 10a in a stacked manner. The first chip 10a is electrically connected to the substrate 11a by means of a first set of gold wires 13a, and the second chip 12a is electrically connected to the same by means of a second set of gold wires 14a. One drawback to this multi-chip module, however, is that the second chip 12a should be smaller in size than the first chip 10a due to the reason that part of the surface of the first chip 10a is occupied by the first set of gold wires 13a. This restriction limits the use of this multi-chip module to pack chips of the same size or variably-selected sizes.

One solution to the foregoing problem is disclosed in U.S. Pat. No. 5,793,108, which is illustrated in FIG. 7. This patented multi-chip module 1b is characterized by that it includes two chips 10b, 12b which are mounted in a stacked back-to-back manner over a die pad 110b, wherein the first chip 10b has its active surface adhered to the die pad 110b and electrically connected to the leads 111b by means of a first set of gold wires 13b, and the second chip 12b has its non-active surface adhered to the non-active surface of the first chip 10b and electrically connected to the leads 111b by means of a second set of gold wires 14b. This stacked back-to-back structure allows two chips of the same size to be packed in the same module. One drawback to this multi-chip module, however, is that it would be unsuitable for use to pack two chips of the same functionality due to the reason that it would be difficult to arrange the I/O pads on the two chips for external connections.

Another solution that can pack two or more chips of the same size or variably-selected sizes in the same module is disclosed in U.S. Pat. No. 5,323,060, which is illustrated in FIG. 8. As shown, this patented multi-chip module 1c can be used to pack a plurality of chips, for example four chips 10c, 11c, 12c, 13c, of the same size. These chips 10c, 11c, 12c, 13c are mounted in a stacked manner and adhered to each other by means of adhesive layers 14c. The first chip 10c is electrically connected to the leads 157c by means of a first set of gold wires 16c; the second chip 11c is electrically connected to the same by means of a second set of gold wires 17c; the third chip 12c is electrically connected to the leads 157c by means of a third set of gold wires 18c; and the fourth chip 13c is electrically connected to the leads 157c by means of a fourth set of gold wires 19c. One drawback to this patented multi-chip module, however, is that the adhesive layers 14c should be greater in height than those parts of the gold wires that are positioned above the chips 10c, 11c, 12c, 13c, and smaller in horizontal extent than the chips 10c, 11c, 12c, 13c so that they would not touch the gold wires 16c, 17c, 18c, 19c. This structure allows the chips 10c, 11c, 12c, 13c to be variably sized according to actual needs. This patented multi-chip module, however, has the following drawbacks. First, only the bond pads on the bottommost chip 10c are under-supported, while the bond pads on the over-laid chips 11c, 12c, 13c are suspended without undersupport. Therefore, during wire-bonding process, it would easily cause these overlaid chips 11c, 12c, 13c to be cracked. Second, in the event that the adhesive layers 14c are inadequately dimensioned to the required thickness, it would make the wire-bonding process for the bonding wires 16c, 17c, 18c, 19c to be difficult to carry out. Third, it would make the resulted multi-chip module exceedingly great in height and therefore would not meet compactness requirement. Fourth, due to the existence of the adhesive layers 14c between the chips 10c, 11c, 12c, 13c, there would exist voids between the chips 10c, 11c, 12c, 13c after the multi-chip module is encapsulated through molding process, which would adversely degrade the quality of the resulted multi-chip module.

Still another solution that can pack two or more chips of the same size or variably-selected sizes in the same module is disclosed in U.S. Pat. No. 5,721,452, which is illustrated in FIG. 9. As shown, this patented multi-chip module 1d includes a first chip 10d and a second chip 12d. The first chip 10d has two rows of edge-located bond pads 100d, and the second chip 12d also has two rows of edge-located bond pads 120d. This patented multi-chip module is characterized by that the first chip 10d is stacked in a crossed manner over the second chip 12d, so that the bond pads 100d on the first chip 10d can be separately positioned from the bond pads 120d on the second chip 12d, allowing a first set of gold wires 13d to be connected to the bond pads 100d on the first chip 10d and a second set of gold wires 14d to be connected to the bond pads 120d on the second chip 12d without difficulty. One drawback to this patented multi-chip module, however, is that the bond pads 120d on the overlaid second chip 12d are suspended without undersupport, which would easily cause the second chip 12d to be cracked during the wire-bonding process for the second chip 12d. One solution to this problem is to dispose a pillar (not shown) beneath the bond pads 120d to undersupport the bond pads 120d. One drawback to this solution, however, is that it would make the overall fabrication process more complex and costly to implement. Moreover, by this patented technology, the bond pads 100d on the first chip 10d can only be edge-located but cannot be peripherally-located; and the bond pads 120d on the second chip 12d can only be edge-located but cannot be peripherally-located; otherwise, it would make the wire-bonding process difficult to carry out.

SUMMARY OF THE INVENTION

It is therefore an objective of this invention to provide a multi-chip module and method of fabricating the same, which can be used to pack two or more chips of variably-selected sizes in the same module.

It is another objective of this invention to provide a multi-chip module and method of fabricating the same, which can prevent the chips from being cracked during wire-bonding process.

It is still another objective of this invention to provide a multi-chip module and method of fabricating the same, which allows the resulted package size to be low in height.

It is yet another objective of this invention to provide a multi-chip module and method of fabricating the same, which can be used to pack two or more chips of the same functionality in the same package.

It is still yet another objective of this invention to provide a multi-chip module and method of fabricating the same, which can be used to pack two or more chips with variously-located bond pads, including single-sided, double-sided, and peripherally-located bond pads, in the same package.

It is still yet another objective of this invention to provide a multi-chip module and method of fabricating the same, which can prevent the existence of voids in the encapsulation body so as to assure the quality of the resulted package.

In accordance with the foregoing and other objectives, the invention proposes a new multi-chip module and method of fabricating the same.

The multi-chip module of the invention comprises: a chip carrier, at least a first semiconductor chip having an active surface and a non-active surface, with the non-active surface being adhered to the chip carrier; a first set of bonding wires, each having an outer end bonded to the chip carrier and an inner end bonded to the active surface of the first semiconductor chip to electrically connect the first semiconductor chip to the chip carrier; at least a second semiconductor chip having an active surface and a non-active surface; an adhesive layer for adhering the non-active surface of the second semiconductor chip to the active surface of the first semiconductor chip; the adhesive layer being formed to a thickness that allows it to entirely wrap the part of the first set of bonding wires that is positioned above the active surface of the first semiconductor chip to prevent the first set of bonding wires to come in contact with the non-active surface of the second semiconductor chip; a second set of bonding wires, each bonded to the active surface of the second semiconductor chip to electrically connect the second semiconductor chip to the chip carrier; and an encapsulation body for encapsulating the first semiconductor chip, the first set of bonding wires, the second semiconductor chip, and the second set of bonding wires.

To allow the bent portions of the first set of bonding wires to be positioned above the substrate rather than above the first semiconductor chip, a reverse wire-bonding technique is employed, by which the first set of bonding wires are bonded in such a manner that the outer ends thereof are first bonded to the substrate, and then the inner ends thereof are pulled up towards the bond pads of the first semiconductor chip and then stitch bonded to the bond pads. Owing to the reverse wire-bonding, the topmost portion of the first set of bonding wires would be nearly leveled with the top surface of the first semiconductor chip rather than exceedingly above the top surface of the first semiconductor chip.

The substrate can be, for example, a BGA (Ball Grid Array) substrate having a front surface and a back surface, wherein the front surface is used for die mounting and is formed with a plurality of electrically-conductive traces, while the back surface is used for the attachment of an array of solder balls which allows the chips on the front surface to be electrically connected to external circuitry.

In another embodiment, the substrate can be a leadframe having a die pad for die mounting and a plurality of leads for the wire-bonding of the chips.

The multi-chip module of the invention can be used to pack two or more chips in a stacked manner in the same package. It is a characteristic feature of the invention that the wire-bonding process for the second chip should be performed through a reverse wire-bonding technique, by which the outer ends of the bonding wires are first bonded to the substrate, and then the inner ends thereof are pulled up towards the bond pads of the first semiconductor chip and then stitch bonded to the bond pads. After that, an adhesive layer is coated to entirely wrap the part of the first set of bonding wires that is positioned above the first chip.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The multi-chip module and method of fabricating the same according to the invention is disclosed in full details by way of several preferred embodiments in the following with reference to FIG. 1, FIG. 2, FIG. 3, FIG. 4 and FIG. 5, respectively.

Figure 1:
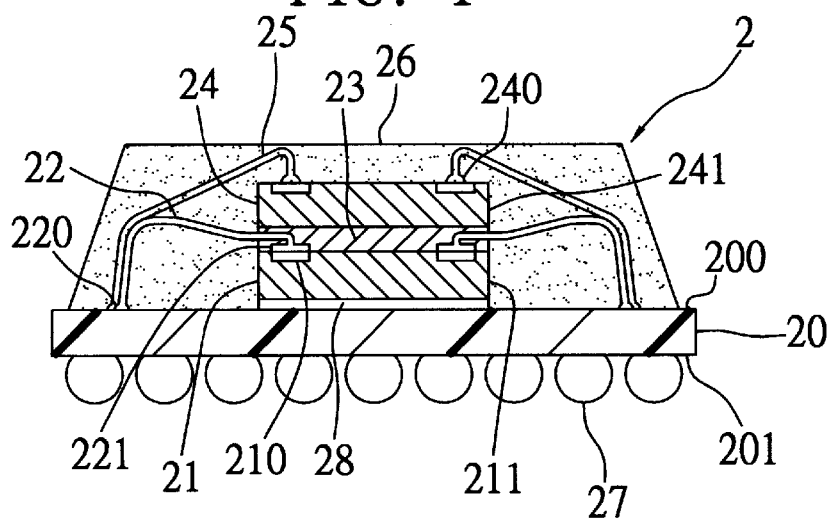
FIG. 1 is a schematic diagram showing a first preferred embodiment of the multi-chip module of the invention.

First Preferred Embodiment (FIG. 1)

FIG 1. is a schematic diagram showing the first preferred embodiment of the multi-chip module of the invention.

As shown, the multi-chip module 2 includes a substrate 20 having a front surface 200 and a back surface 201; a first semiconductor chip 21 mounted over the front surface 200 of the substrate 20; a first set of gold wires 22 for electrically connecting the semiconductor chip 21 to the substrate 20; a second semiconductor chip 24 adhered by means of an adhesive layer 23 over the first semiconductor chip 21; a second set of gold wires 25 for electrically connecting the second semiconductor chip 24 to the substrate 20; and an encapsulation body 26 for encapsulating the first semiconductor chip 21, the first set of gold wires 22, the second semiconductor chip 24, and the second set of gold wires 25.

The substrate 20 is a two-layer substrate with electrically-conductive traces formed by etching through copper foils.

The back surface 201 of the substrate 20 is attached with a solder ball 27 to allow the first semiconductor chip 21 and second semiconductor chip 24 to be electrically connected to external circuitry (not shown).

The first semiconductor chip 21 is adhered to the front surface 200 of the substrate 20 by means of an adhesive layer 28, such as silver paste or polyimide tape. The first semiconductor chip 21 is formed with a plurality of bond pads 210 for the first set of gold wires 22 to be bonded thereon. To allow the bent portions of the first set of gold wires 22 to be positioned above the substrate 20 rather than above the first semiconductor chip 21, a reverse wire-bonding technique is employed, by which the first set of gold wires 22 are bonded in such a manner that the outer ends 220 thereof are first bonded to the substrate 20, and then the inner ends 221 thereof are pulled up towards the bond pads 210 of the first semiconductor chip 21 and then stitch bonded to the bond pads 210. Owing to the reverse wire-bonding, the topmost portion of the first set of gold wires 22 would be nearly leveled with the top surface of the first semiconductor chip 21 (rather than exceedingly above the top surface of the first semiconductor chip 21).

After the wire-bonding process for the first set of gold wires 22 is completed, the next step is to coat an electrically-insulative adhesive layer 23, such as epoxy resin, over the first semiconductor chip 21. The adhesive layer 23 should be coated in such a manner as to allow it to entirely wrap the part of the first set of gold wires 22 that is positioned directly above the first semiconductor chip 21, so that the wrapped part of the first set of gold wires 22 can be prevented from being damaged during the die-bonding process for mounting the second semiconductor chip 24 over the first semiconductor chip 21. Moreover, the provision of the adhesive layer 23 allows no air gap to be left between the first semiconductor chip 21 and the second semiconductor chip 24, so that it can help to prevent the undesired forming of voids between the two chips 21, 24 after the encapsulation body 26 is formed. This benefit allows the multi-chip module to be prevented from the popcorn effect while undergoing high-temperature conditions during subsequent fabrication steps.

Moreover, since the adhesive layer 23 needs just to be dimensioned to a thickness enough to cover the part of the first set of gold wires 22 that is positioned between the first semiconductor chip 21 and the second semiconductor chip 24, the adhesive layer 23 can be made small in thickness, allowing the overall stacked structure of the first semiconductor chip 21 and the second semiconductor chip 24 to be made smaller in height than the prior art of U.S. Pat. No. 5,323,060. Therefore, the resulted multi-chip module can be made more compact than the prior art. In addition, since the first set of gold wires 22 are bonded to the first semiconductor chip 21 in a reverse manner, it allows the topmost bent portion of the first set of gold wires 22 to be positioned beyond the first semiconductor chip 21, and also allows the part positioned between the first semiconductor chip 21 and the second semiconductor chip 24 to be entirely buried in the adhesive layer 23, thereby preventing the first set of gold wires 22 from being damaged by the mounting of the second semiconductor chip 24 onto the first semiconductor chip 21. This benefit allows an increase in the yield of the production. In addition, it allows the bonding of the first set of gold wires 22 and the second set of gold wires 25 to be unrestricted by the positions of the bond pads on the chips as in the case of the prior art of U.S. Pat. No. 5,721,452. This allows the bond pads on the first semiconductor chip 21 and the second semiconductor chip 24 to be either single-sided array, or double-sided array, or peripheral-sided array.

As the second semiconductor chip 24 is mounted in position by means of the adhesive layer 23, the second set of gold wires 25 are bonded through conventional technique to connect the second semiconductor chip 24 to the substrate 20. Since the bond pads 240 on the second semiconductor chip 24 are supported through the adhesive layer 23 by the first semiconductor chip 21 without being suspended, it can prevent the second semiconductor chip 24 from being cracked while bonding the second set of gold wires 25 to the bond pads 240, thereby assuring the quality of the bonding between the second set of gold wires 25 and the bond pads 240 without having to thicken the second semiconductor chip 24. In the case of the second semiconductor chip 24 being greater in size than the first semiconductor chip 21, the edge 241 of the second semiconductor chip 24 is unaligned with the edge 211 of the first semiconductor chip 21. However, provided that the center line of the bond pads 240 on the second semiconductor chip 24 is positioned not beyond the edge 211 of the first semiconductor chip 21, it allows the bond pads 240 to be adequately supported by the first semiconductor chip 21, so that the second semiconductor chip 24 can be prevented from being cracked during the wire-bonding process. In addition, the invention also allows the second semiconductor chip 24 to be smaller in size than the first semiconductor chip 21. In this case, owing to the provision of the adhesive layer 23 between the first semiconductor chip 21 and the second semiconductor chip 24, the first set of gold wires 22 can be prevented from being damaged while mounting the second semiconductor chip 24.

As the wire-bonding process for the second set of gold wires 25 is completed, a molding process is performed to form an encapsulation body 26 to encapsulate the first semiconductor chip 21, the first set of gold wires 22, the second semiconductor chip 24, and the second set of gold wires 25. By the invention, since there is no air gap left between the first semiconductor chip 21 and the second semiconductor chip 24, the resulted encapsulation body 26 would have no voids, allowing the finished multi-chip module to be assured in reliability.

Figure 2:
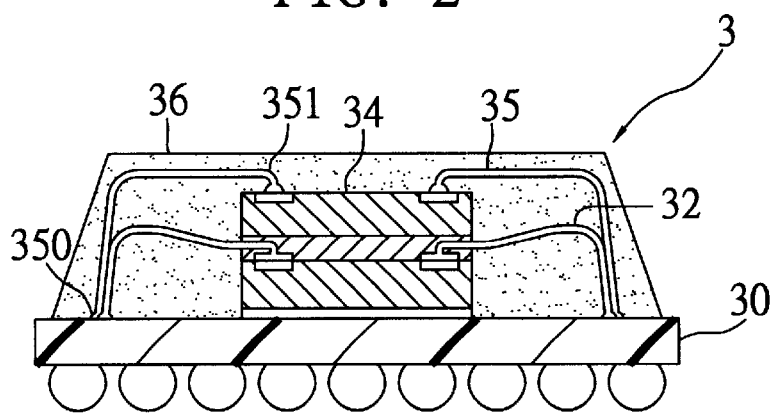
FIG. 2 is a schematic diagram showing a second preferred embodiment of the multi-chip module of the invention.

Second Preferred Embodiment (FIG. 2)

FIG. 2 is a schematic diagram showing the second preferred embodiment of the multi-chip module of the invention. As shown, the multi-chip module 3 of the second preferred embodiment differs from the previous one only in that the second set of gold wires 35 are bonded also through the reverse wire-bonding technique as the first set of gold wires 32; i.e., the outer ends 350 thereof are first bonded to the substrate 30, and then the inner ends 351 thereof are bonded to the second semiconductor chip 34, so as to allow the top-most bent portion of the second set of gold wires 35 to be positioned beyond the second semiconductor chip 34 and above the substrate 30. As a result, the part of the second set of gold wires 35 that is positioned above the second semiconductor chip 34 can have a low profile, allowing the finished multi-chip module to be made even more compact than that of the previous embodiment.

Figure 3:
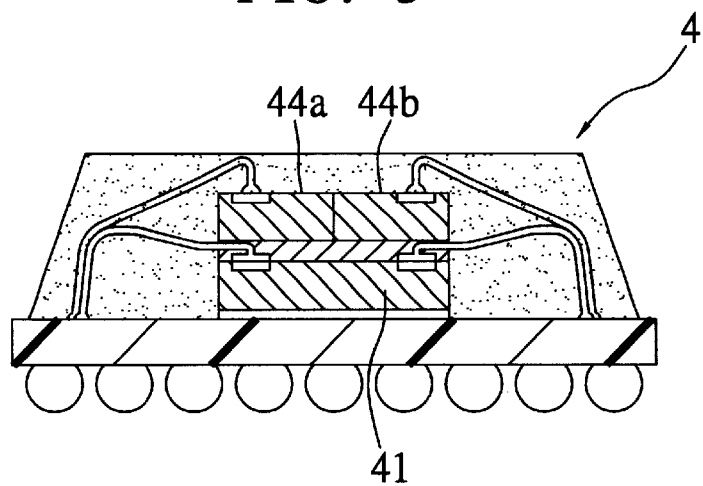
FIG. 3 is a schematic diagram showing a third preferred embodiment of the multi-chip module of the invention.

Third Preferred Embodiment (FIG. 3)

FIG. 3 is a schematic diagram showing the third preferred embodiment of the multi-chip module of the invention. As shown, the multi-chip module 4 of the third preferred embodiment is a triple-chip module composed of three chips: a first chip 41, a second chip 44a, and a third chip 44b, and wherein the second chip 44a and the third chip 44b are mounted in a juxtaposed manner over the first chip 41. This allows the finished multi-chip module to offer an increased level of functionality.

Figure 4:
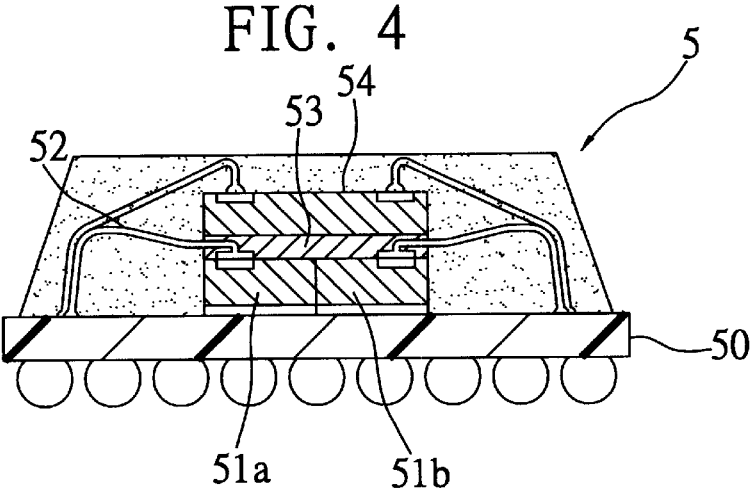
FIG. 4 is a schematic diagram showing a fourth preferred embodiment of the multi-chip module of the invention.

Fourth Preferred Embodiment (FIG. 4)

FIG. 4 is a schematic diagram showing the fourth preferred embodiment of the multi-chip module of the invention As shown, the multi-chip module 5 of the fourth preferred embodiment is also a triple-chip module composed of three chips: a first chip 51*a*, a second chip 51*b*, and a third chip 54, and wherein the first chip 51*a* and the second chip 51*b* are mounted in a juxtaposed manner over the substrate 50, and the third chip 54 is adhered by means of an adhesive layer 53 over the juxtaposed first chip 51*a* and second chip 51*b*. Further, the juxtaposed first chip 51*a* and second chip 51*b* are electrically connected to the substrate 50 through bonding wires 52. This embodiment also allows the finished multi-chip module to offer an increased level of functionality.

Figure 5:
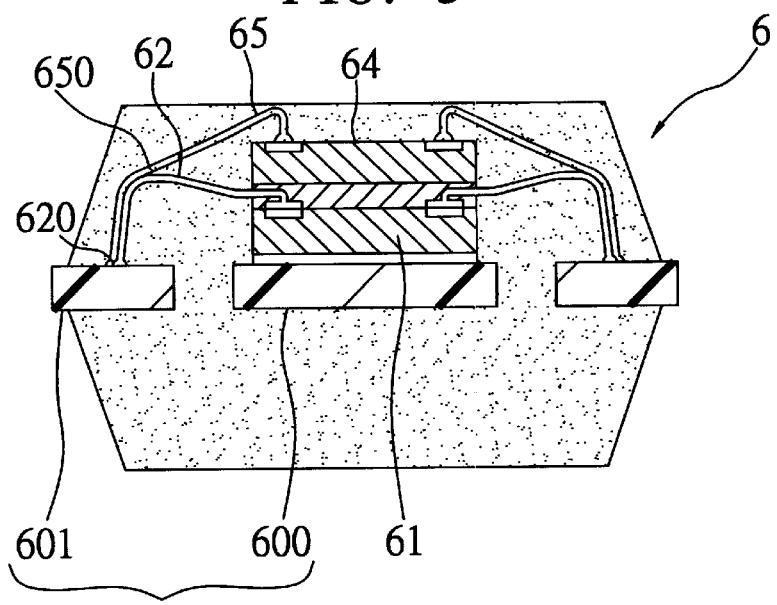
FIG. 5 is a schematic diagram showing a fifth preferred embodiment of the multi-chip module of the invention.
Figure 6:
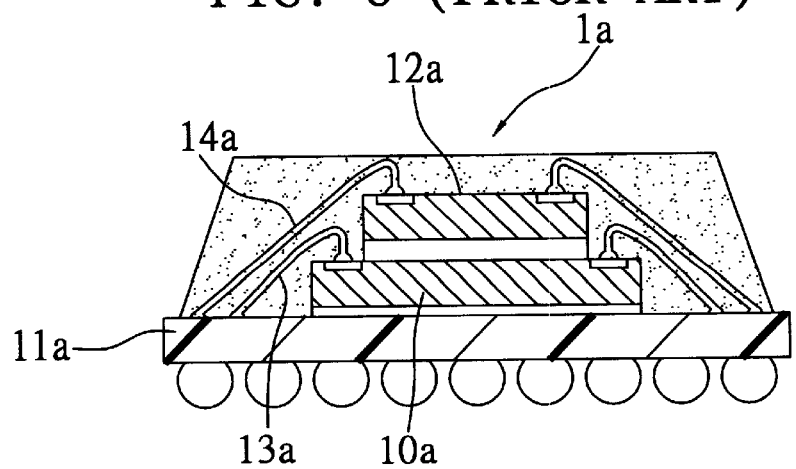
FIG. 6 (PRIOR ART) is a schematic diagram showing a first conventional multi-chip module.
Figure 7:
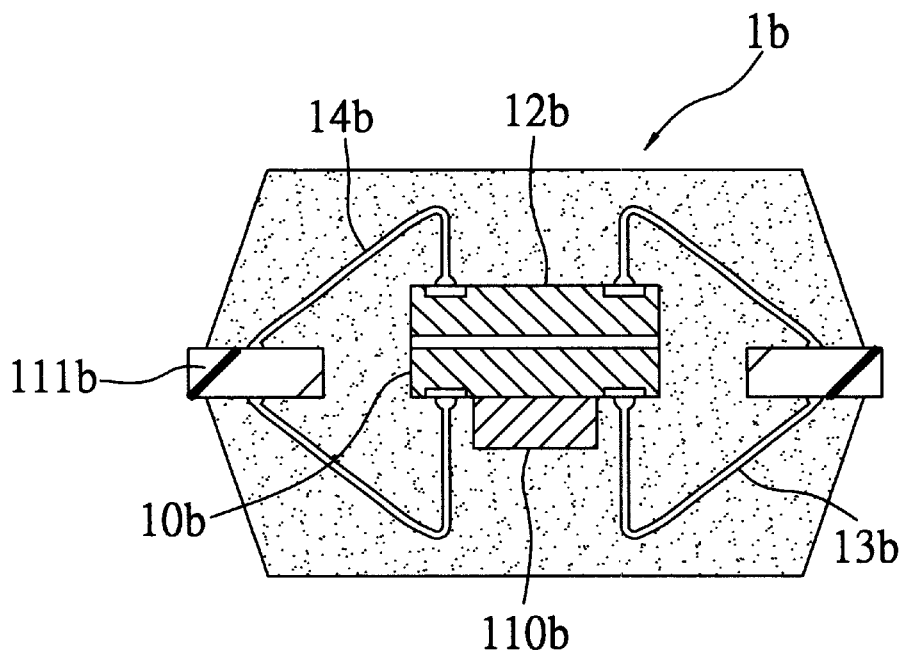
FIG. 7 (PRIOR ART) is a schematic diagram showing a second conventional multi-chip module.
Figure 8:
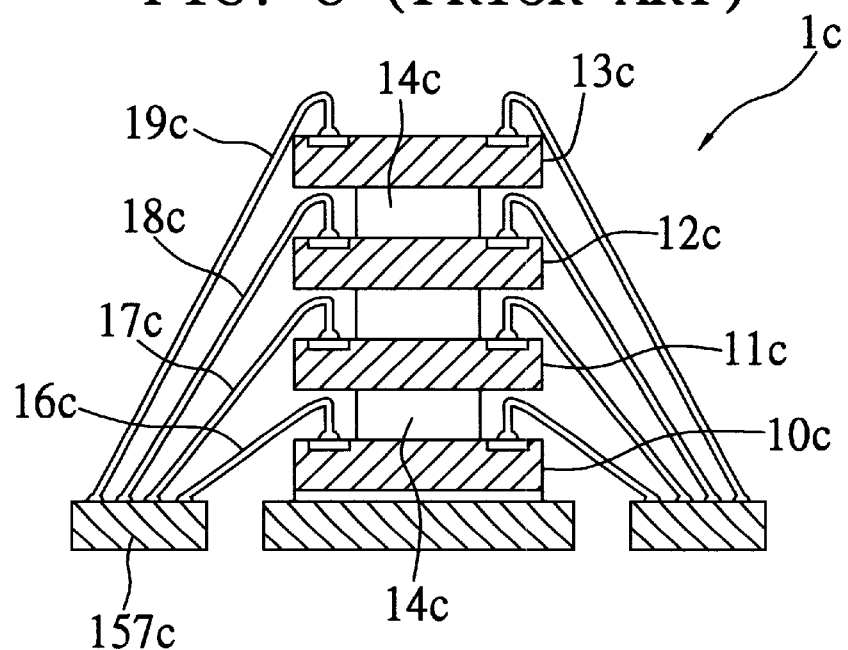
FIG. 8 (PRIOR ART) is a schematic diagram showing a third conventional multi-chip module.
Figure 9:
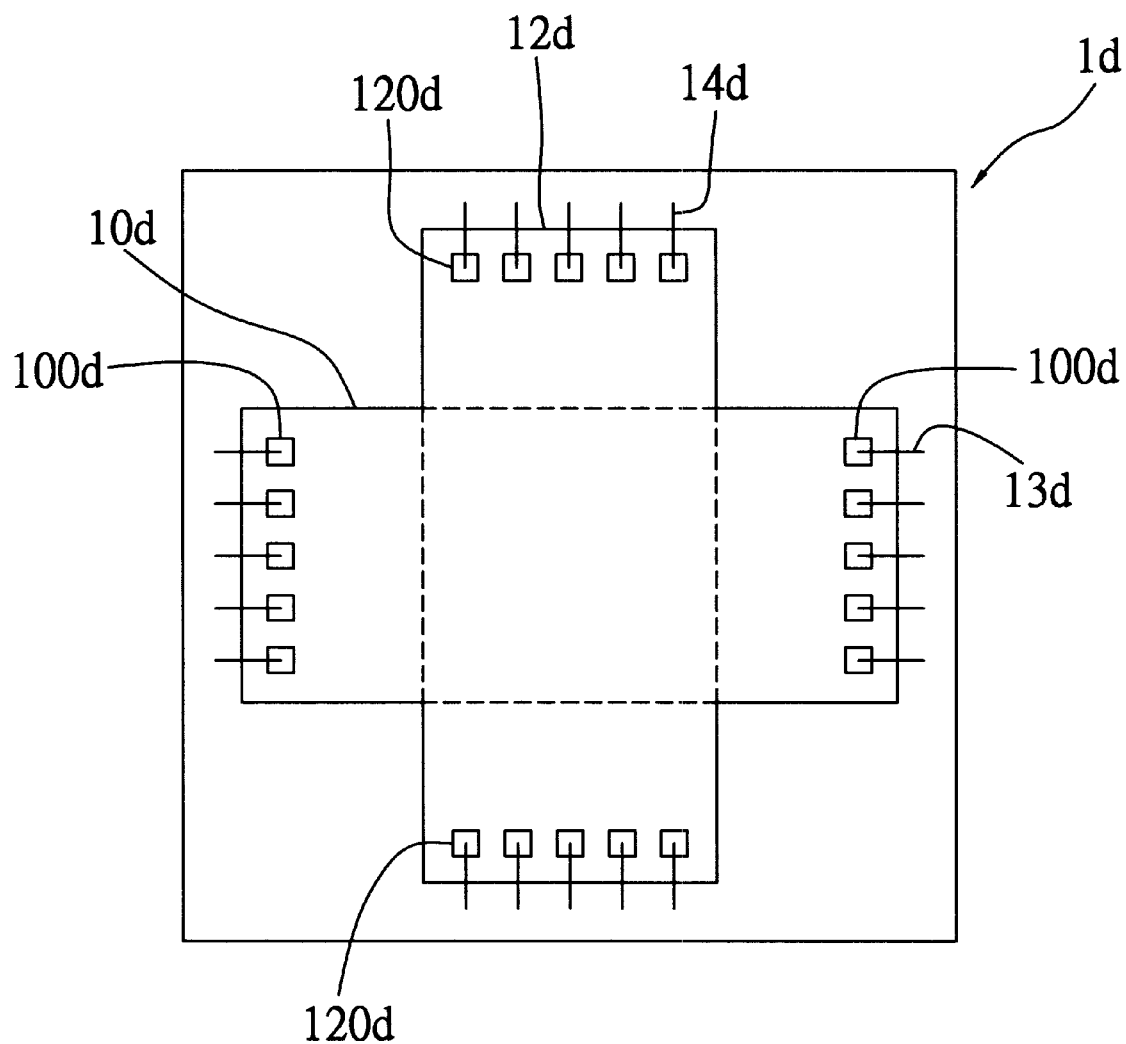
FIG. 9 (PRIOR ART) shows a top view of a fourth conventional multi-chip module.

Fifth Preferred Embodiment (FIG. 5)

FIG. 5 is a schematic diagram showing a fifth preferred embodiment of the multi-chip module of the invention.

As shown, the multi-chip module 6 of the fifth preferred embodiment differs from the first one shown in FIG. 1 only in that the first chip 61 is mounted on the die pad 600 of a leadframe 60 (rather than on substrate as in the case of the first embodiment), and a second chip 64 is mounted over the first chip 61. The first chip 61 and the second chip 64 are electrically connected to the inner leads 601 of the leadframe 60 by means of a first set of gold wires 62 and a second set of gold wires 65 whose outer ends 620, 650 are bonded to the inner leads 601.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip module, comprising:

a chip carrier;

at least a first semiconductor chip having an active surface and a non-active surface, with the non-active surface being adhered to the chip carrier, a first set of bonding wires, each having an outer end bonded to the chip carrier and an inner end bonded to the active surface of the first semiconductor chip to electrically connect the first semiconductor chip to the chip carrier;

at least a second semiconductor chip having an active surface and a non-active surface;

an adhesive layer for adhering the non-active surface of the second semiconductor chip to the active surface of the first semiconductor chip; the adhesive layer being formed to a thickness that allows it to entirely wrap the part of the first set of bonding wires that is positioned above the active surface of the first semiconductor chip to prevent the first set of bonding wires to come in contact with the non-active surface of the second semiconductor chip;

a second set of bonding wires, each bonded to the active surface of the second semiconductor chip to electrically connect the second semiconductor chip to the chip carrier; and an encapsulation body for encapsulating the first semiconductor chip, the first set of bonding wires, the second semiconductor chip, and the second set of bonding wires.

2. The multi-chip module of claim 1, wherein the first set of bonding wires have a bent portion positioned beyond the first semiconductor chip and above the chip carrier.

3. The multi-chip module of claim 1, wherein the part of the first set of bonding wires that is positioned between the first semiconductor chip and the second semiconductor chip is substantially oriented in parallel with the active surface of the first semiconductor chip.

4. The multi-chip module of claim 1, wherein the first set of gold wires and the first set of bonding wires are gold wires.

5. The multi-chip module of claim 1, wherein the first semiconductor chip is greater in size than the second semiconductor chip.

6. The multi-chip module of claim 1, wherein the first semiconductor chip is equal in size to the second semiconductor chip.

7. The multi-chip module of claim 1, wherein the first semiconductor chip is smaller in size than the second semiconductor chip.

8. The multi-chip module of claim 1, wherein the chip carrier is a substrate which is composed of a core layer and electrically-conductive traces formed over both sides of the core layer.

9. The multi-chip module of claim 8, further comprising:

a solder ball attached to the terminals of the electrically-conductive traces over the chip carrier.

10. The multi-chip module of claim 1, wherein the chip carrier is a leadframe which is composed of a die pad and a plurality of leads.

* * * * *